United States Patent [19]

Freeman

[11] Patent Number: 4,825,392
[45] Date of Patent: Apr. 25, 1989

[54] DUAL FUNCTION DMM DISPLAY

[76] Inventor: Mark S. Freeman, 612 19th St., Snohomish, Wash. 98290

[21] Appl. No.: 898,250

[22] Filed: Aug. 20, 1986

[51] Int. Cl.$^4$ .......................... G01D 7/04; G01R 27/00
[52] U.S. Cl. .................................... 364/550; 364/481; 364/556
[58] Field of Search ............... 364/424, 481, 483, 556, 364/557, 550, 551; 340/52 F

[56] References Cited

U.S. PATENT DOCUMENTS

| | | | |
|---|---|---|---|
| 3,999,046 | 12/1978 | Porter | 364/556 X |
| 4,181,957 | 1/1980 | Pinckaers | 364/557 |
| 4,249,186 | 2/1981 | Edwards | 364/550 |
| 4,593,357 | 6/1986 | Van Ostrand et al. | 364/424 |
| 4,594,572 | 6/1986 | Haubner et al. | 340/52 F |
| 4,608,532 | 8/1986 | Ibar et al. | 364/556 X |
| 4,611,193 | 9/1986 | Brüggemann | 340/52 F |

FOREIGN PATENT DOCUMENTS

| | | | |
|---|---|---|---|
| 993179 | 5/1965 | United Kingdom . | |
| 1298627 | 12/1972 | United Kingdom | 364/551 |
| 2009543 | 6/1979 | United Kingdom . | |
| 2107456 | 4/1983 | United Kingdom . | |
| 2133164 | 7/1984 | United Kingdom . | |
| 2164478 | 3/1986 | United Kingdom | 364/483 |

Primary Examiner—Felix D. Gruber

[57] ABSTRACT

A digital multimeter (DMM) includes a microprocessor controller programmed for simulating operation of a plurality of DMM's by providing concurrent and substantially simultaneous displays of results of plural time-shared measurements. The microprocessor controls a single measurement and data conversion system to perform a plurality of separate measurements in a time-shared manner. Results of the plurality of separate, sequentially performed, measurements are concurrently displayed, substantially simultaneously, on a plurality of separate displays of the digital multimeter in accordance with the operation of the controller. The single multimeter of the invention thus simulates operation of a plurality of DMM's.

16 Claims, 3 Drawing Sheets

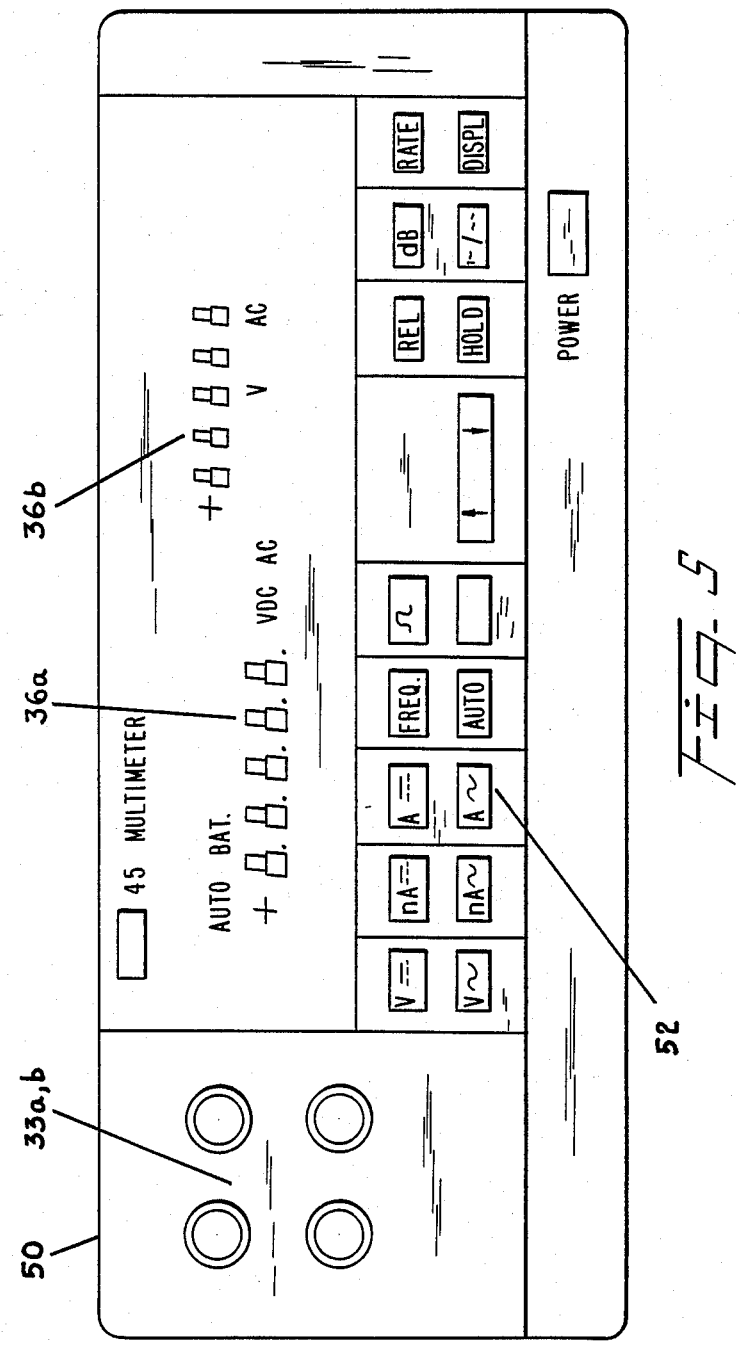

DUAL FUNCTION DMM DISPLAY

TECHNICAL FIELD

This invention relates to multifunction measurement devices, and more specifically to devices provided with a single measurement circuit for time-shared use in performing a plurality of diverse measurements, and further provided with a plurality of displays for simultaneously displaying results of the plural diverse measurements.

BACKGROUND ART

In the measurement art it is known to use a single meter for performing any one of a number of different measurement functions. Such meters are known as multimeters, and encompass volt-ohm meters (VOM) and vacuum-tube voltmeters (VTVM) as illustrative examples. Multimeters which are digitally controlled, or have digital output displays, are known as digital multimeters (DMM). DMM's, similarly to other multimeters, include a single metering device which, under control of a programmed controller, is capable of performing at any one time a single measurement function of a single parameter. The resultant function is displayed to a predetermined accuracy on a single, multidigit, display.

The meters of the prior art, particularly DMM's, thus include sensitive measurement circuitry as well as sophisticated control circuitry. In a DMM, for example, a programmed microprocessor may be used as the controller, together with an external keyboard or other device for inputting control signals and user commands to set a desired measurement function. Because a microprocessor controller is used, the number of measurement functions which may be performed by the meter is significantly increased. DMM's are thus expensive devices capable of sophisticated individual measurements.

A typical measurement meter utilizes a set of input leads which include probes for contacting circuit nodes at which desired parameters are to be measured. As is known in the art, typically two such input leads are required to measure an electrical parameter such as current or voltage. A DMM controller is capable of causing the measuring device to perform various functions for determining a number of characteristics of a measured electrical signal parameter, such as determining current or voltage frequency, peak or RMS AC values, DC values, impedance ratios, and the like.

In many instances it is desirable or necessary to measure several different circuit parameters, or to obtain several characteristics of one or more measured parameters, at one or more circuit points. For example, it may be necessary to determine the current or voltage at two separate circuit points, or to determine both current and voltage at a single circuit location. Alternatively, it may be necessary to measure frequency and amplitude of a signal at a particular circuit location in order to determine a frequency response of the circuit. Still further, it may be necessary to determine the impedance of one circuit parameter and to determine a voltage thereacross or a voltage or current at a different circuit location.

In each of the above illustrations, in the prior art it is necessary to use two prior art DMM's or other measurement devices for performing the necessary measurements and for providing output displays indicative of the measurement results. However, as noted above, the use of plural meters is expensive because of complete duplication of an entire measurement system. Thus, in some situations, a user may be tempted or required to use a single meter in order to reduce expenses. In such an arrangement, the user will provide a first input command to the controller (as by providing a first setting for a measurement function key) to obtain a first measurement, and thereafter will provide a second input command to the controller (as by providing a second setting for the measurement function key) to obtain the second measurement.

However, under these circumstances the measurements, which are performed by a single instrument, are separated by a significant time lapse, which is necessary for a user to enter two commands to the meter and/or to reconnect the meter input leads to different circuit points. Moreover, since only a single meter is used, the user is required to rely on his or her memory to recall both measurements.

Clearly, measurements performed in such a manner may provide erroneous results, in that values of two parameters are obtained only after substantial time separation and in that one or both of the measured parameters may be forgotten by the user or may be incorrectly recalled. In those instances where substantially simultaneous readings are necessary, and where it is necessary for a user to be provided with concurrent displays of two or more measurement results, an expensive arrangement is required in which plural meters are used.

There is thus a need in the prior art for an inexpensive device capable of performing a plurality of measurements and of providing substantially simultaneous and concurrent displays of the measurement results.

SUMMARY OF THE INVENTION

It is accordingly an objective of the invention to overcome the difficulties of the prior art and to provide a single measurement apparatus for measurement of a plurality of parameters or characteristics thereof, and for concurrent display of a plurality of separate measurement results.

It is a more specific object of the invention to provide an inexpensive measurement apparatus, in which a single measurement circuit is used in a time-shared fashion to measure a plurality of parameters or characteristics, and in which the measurement results are concurrently displayed on a plurality of displays.

It is yet another object of the invention to provide a measurement apparatus in which a programmable microprocessor controller controls a single measurement circuit to perform a sequence of measurements of separate parameters provided thereto by one or more sets of input leads, and in which the results of each of the measurements are displayed substantially concurrently and simultaneously on predetermined, separate, plural displays.

In accordance with the above and other objects of the invention there is disclosed a measuring apparatus for measurement of a plurality of characteristics of various parameters of a signal under test, provided to the apparatus by a set of input leads. In the inventive measuring apparatus a single measuring means is provided for shared use in measuring the plural characteristics. The single measuring means measures only one of the plural characteristics at any one time, and a control means is provided for selecting the plurality of characteristics to be measured sequentially by the single measuring means. The single measuring means thus provides plural data representing the sequential measurements performed under control of the control means. A plurality of displays are provided for concurrent display of the data representing the plural sequential measurements.

Preferably, the control means includes a programmable microprocessor which is programmed to select at least first and second characteristics to be measured by the single measuring means in sequence, so that the plural displays indeed provide concurrent displays of the sequentially performed measurements. The microprocessor may further be programmed to select at least first and second functions to be performed by the single measuring means on the electrical parameters provided to the single measuring means, so that different characteristics of a single parameter may be measured and displayed concurrently by the plural displays. The specific characteristics or functions may be selected by a user through the use of a keyboard or other input means to provide inputs to the programmed microprocessor.

In accordance with another aspect of the invention, there is provided an improvement to a measurement apparatus which includes a measurement circuit, a microprocessor for the output signals therefrom, a display driver, and a display. Pursuant to the invention, the measurement apparatus includes a plurality of displays, and the microprocessor is programmed to cause the measurement circuit to perform a sequence of functions and to direct the results of specific functions to specific displays.

In accordance with one form of the improvement, the microprocessor may be programmed to cause the measurement circuit to perform a sequence of functions on a sequence of input parameters provided thereto, and to direct the results of specific functions to specific displays. Thus, different measurements may be performed on different signals, and the results may be concurrently displayed.

In accordance with another form of the invention, the microprocessor may be programmed to cause the measurement circuit to perform a sequence of functions on a single set of input parameters, and to direct the results of specific functions to specific displays. Thus, different measurements may be performed on the same signals, and the results may be concurrently displayed.

These and other aspects, features and advantages of the invention will become more readily apparent to one of ordinary skill in the art to which the invention pertains upon reading the following description of the best mode for carrying out the invention, together with the drawings illustrating the same.

BRIEF DESCRIPTION OF THE DRAWINGS

FIG. 5 shows a front panel of a meter incorporating the features of the invention.

DETAILED DESCRIPTION OF A PREFERRED EMBODIMENT

Figure 1:
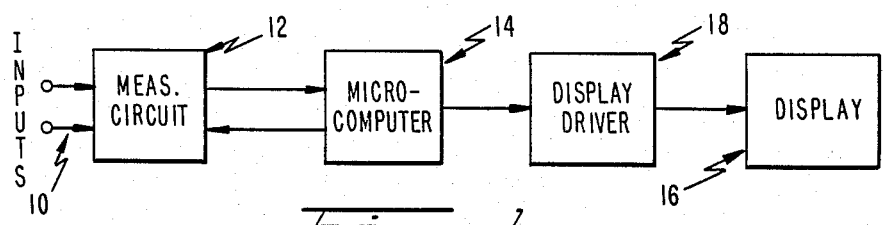
FIG. 1 illustrates a block diagram of a prior art digital multimeter.

Referring now to the illustration of FIG. 1, there is shown a block diagram representation of a typical digital multimeter (DMM) of the prior art. As is known to those of ordinary skill in the art, such meters operate by providing an input signal on a set of input leads 10 to a measuring circuit 12. The input signal may represent a voltage between two circuit points, a current through a particular circuit element, or the like.

The measuring circuit 12 performs the appropriate function or functions on the signal provided by input leads 10, generates a result, and converts the result to a digital form for processing by a microprocessor 14. For example, measuring circuit 12 may provide analogue-to-digital (AD) conversion of the input signal, and may determine a peak value thereof. One such conversion technique is described in U.S. Pat. No. 4,556,867, assigned to the assignee hereof and incorporated herein by reference.

Alternatively, an RMS value of the input signal may be determined by measuring circuit 12, or the number of zero crossings or polarity changes in the signal may be measured to determine the frequency of the input signal. Where current is to be measured, a voltage may be measured across an appropriate internal impedance and where impedance is to be measured an internally generated voltage may be applied to input leads 10 and the resulting current determined therein.

The appropriate function may be performed by measuring circuit 12 on the input signal parameters in response to a control signal provided by microprocessor 14 to the measuring circuit 12. As hereinabove described, a prior art DMM requires a manual function switch (not shown) to be changed to an appropriate function setting, thereby to provide an appropriate command to the microprocessor. Upon receipt of the appropriate command, the microprocessor controls operation of the measuring circuit 12 to perform the appropriate measurement on, or to obtain the appropriate function of, the input signal.

Once the designated measurement has been made, or the desired function performed, the desired characteristic of the signal (e.g., amplitude, frequency, etc.) is provided by the measuring circuit in digital form to microprocessor 14.

The microprocessor 14 is programmed to convert the settings of the manual function switch to appropriate control signals for measuring circuit 12. Moreover, the microprocessor 14 is programmed to transform the digital information output by the measuring circuit 12 to a format suitable for display on a display 16. The appropriately transformed signals are provided to a display driver 18 in order properly to drive display 16.

Figure 2:
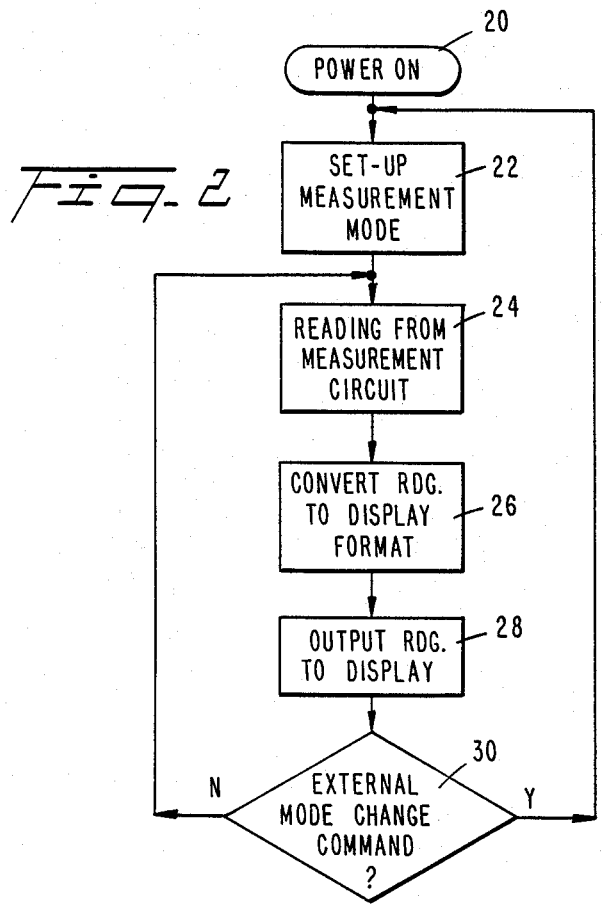
FIG. 2 discloses a flow chart for a microprocessor of the digital multimeter of the prior art.

Referring now to FIG. 2, there is shown a flow chart illustrating operation of microprocessor 14. As described therein, after the instrument is powered-up at step 20, at step 22 the microprocessor initiates the measurement circuit to an appropriate measurement mode determined by the setting of the manual function selecting switch (not shown). The measuring circuit 12 is set to the proper mode in step 22 to perform the desired function or to obtain the desired characteristic of the input signal. At this point the microprocessor 14 enters the main measurement loop of the DMM.

Thereafter, at step 24, the microprocessor 14 reads the output data provided by the measuring circuit 12. At step 26 microprocessor 14 converts the data from measuring circuit 12 to suitable format for display, and transfers the same to the display driver 18 at step 28. The above sequence of operations is repeated until the microprocessor 14 is instructed externally to change measurement mode. As seen at step 30, microprocessor 14 determines whether or not an external mode change command has been provided. If the result of the determination at step 30 is negative, operation resumes at step 24, and measurement of the same characteristic of the input signal continues.

If the result of step 30 is affirmative, i.e., if an external mode change command has been given, such as by changing the setting of the manual function setting switch, operation of microprocessor 14 returns to step 22, wherein the new mode is set. Thus, the microprocessor 14 outputs appropriate control signals for measuring circuit 12 to perform the function newly set by the user. Thereafter, operation in the revised mode continues in a loop, as described, until a further external mode change command is detected at step 30.

Thus, the prior art DMM will repeatedly perform a single type of measurement, will determine a single characteristic of an input signal, and will provide a substantially continuous display of the single measurement until input of an external mode change command.

Such operation may be alternately described by the Program Description Language (PDL) or pseudo-code ilustration which follows:

```
power-up
loop
   set measurement mode
   repeat
      get reading from measuring circuit
      convert reading to display format
      output reading for display
   until different measurement mode selected
endloop.
```

In the present invention both the structure and operation of the prior art are modified in order to provide automatic handling by a single instrument of plural measurements which previously required multiple instruments. More specifically, as previously summarized herein, a single measuring circuit of a single DMM is used to perform at least two functions in sequence, and at least two displays are provided on the single DMM to display the plural results. Thus, by modifying the control program of the microprocessor, by adding a display and by modifying the display driver, there results a DMM which fully simulates operation of two or more DMM's of the prior art.

Figure 3:
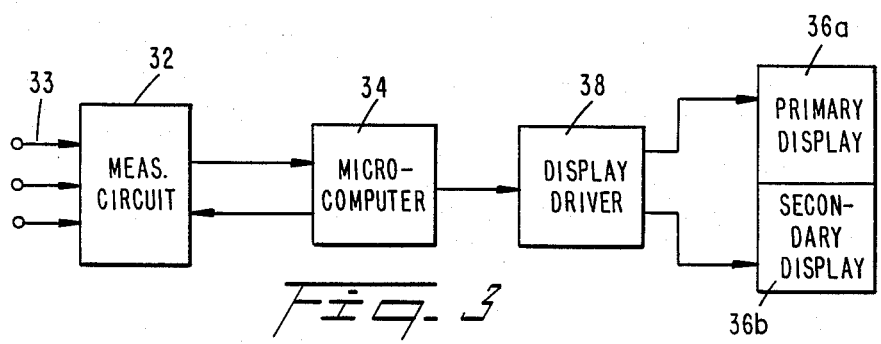
FIG. 3 shows a block diagram of a digital multimeter incorporating the present invention.

Referring now to FIG. 3 there is shown an illustration of a preferred embodiment of the present invention in which a single DMM provides automatic performance of two functions and further provides displays of the results of two measurements.

More specifically, a measuring circuit 32 receives input signals provided on inputs 33. As noted from the Figure, the number of input leads is increased, thereby to permit input of a plurality of different signals or parameters to the measuring circuit. It should be understood, however, that the inventive concept provides a plurality of characteristics for display. The characteristics may be different functions of a single signal or parameter, or may be one or more functions of different signals or parameters input to the measuring circuit.

Thus, the three input leads 33 shown in FIG. 3 are only illustrative of one type of operation, in which voltage signals from two circuit points are input to the single measuring circuit, and in which a common reference potential is similarly input. When it is desired to know the values of the two voltages on two of the input leads relative to the common reference value on the third lead, microprocessor 34 provides control signals to measuring circuit 32 first to measure and determine the voltage value on one of the input leads and thereafter to measure and determine the voltage value on the other of the input leads.

The microprocessor 34 transforms the two output signals to a proper format for display, and provides the same for display on a primary display 36a and on a secondary display 36b. Display driver 38 receives the signals from the microprocessor 34 and, under control thereof, passes the appropriate signal to the appropriate display.

As is apparent from the foregoing, the number of input leads to measuring circuit 32 may be increased over the prior art. However, such a modification does not necessarily increase the complexity of the measuring circuit. Rather, a simple controllable switching circuit (not shown) may be provided at the input to measuring circuit 32. In response to control signals from microprocessor 34 the switching circuit may provide inputs from one or another of a plurality of sets of input leads to the measuring circuit. The same control signals may be provided to the display driver in order to activate the primary or secondary display, 36a or 36b, to display the results of the measurement. Of course, the number of displays provided in the inventive meter need not be limited to two.

Operation of the improved measurement apparatus of the invention is illustrated in the pseudo-code below.

```
power-up
loop
   determine primary and secondary measurement
      modes
   repeat
      set primary measurement mode
      wait for measuring circuit to settle
      obtain primary reading from measuring circuit
      convert primary reading to display format
      set secondary measurement mode
      wait for measuring circuit to settle
      obtain secondary reading from measuring circuit
      convert secondary reading to display format
      output primary and secondary readings to display
   until different pair of measurement modes selected
endloop.
```

Figure 4:
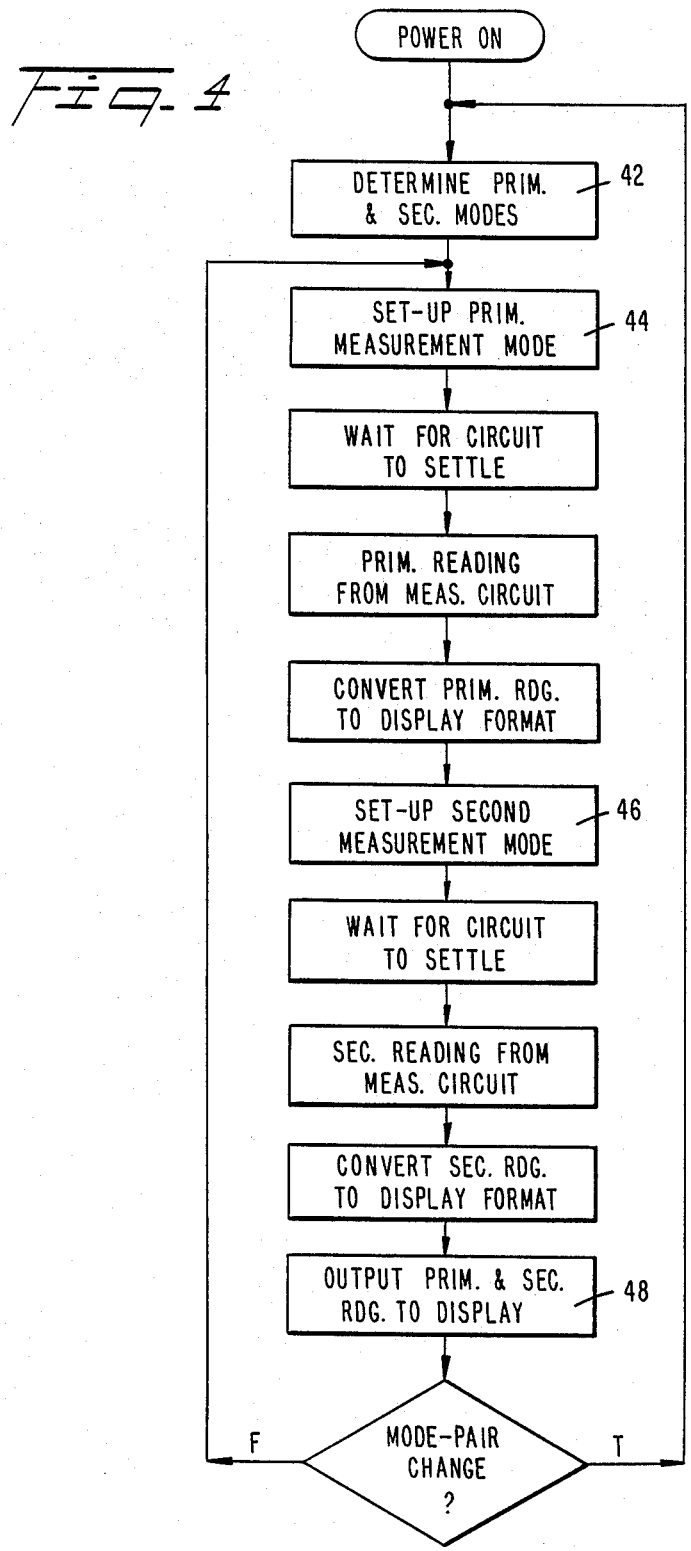
FIG. 4 shows a flow chart for a microprocessor of the inventive multimeter.

The same operation is illustrated in the flow chart of FIG. 4. As shown therein, and as may be understood from the above pseudo-code, modifications of the present invention from existing DMM control programs are required in order to determine a sequence of measurement modes, in response to an external input command. Thus, a single multi-function selection keyboard may be provided, together with an input key identifying a selected function as being a primary or secondary function. In response thereto, at step 42 the microprocessor 34 identifies the specific displays on which specific measured characteristics of the input parameters are to be dispayed.

At step 44 begins a sequence of steps which result in a display output indicating results of the primary measurement. Thus, at step 44a there is provided a delay to permit the measuring circuit to settle. At step 44b microprocessor 34 obtains from the measuring circuit the value of the primary parameter or characteristic being measured, and at step 44c the microprocessor converts this value to an output format suitable for display. At step 46 begins a sequence of steps which result in a further display output indicating results of the secondary measurement. Thus, at step 46a there is provided a delay to permit the measuring circuit to settle. At step 46b microprocessor 34 obtains from the measuring circuit the value of the primary parameter or characteristic being measured, and at step 46c the microprocessor converts this value to an output format suitable for display. At step 48 both display outputs are provided to the display driver 38 for output to, and display on, respective displays 36a and 36b.

The following examples illustrate operation of the present invention. In the several examples are provided settings for the primary and secondary characteristics to be determined by the measuring circuit and to be displayed on the primary and secondary displays of a dual function DMM. The functions, as well as application of the particular dual measurement arrangement, are also described.

| Primary Characteristic | Secondary Characteristic | Description |
|---|---|---|
| dBm | Frequency | Signal level (in dBm) on primary display; frequency on secondary. Used for frequency response measurement. |
| Min/Max | Continuous | Show peak and/or null of signal, while monitoring current signal. Only one measurement needed for two displays. |
| Touch/Hold | Continuous | Capture and hold stable readings on primary display, while showing current input on secondary. One measurement needed for two displays. |
| V | mA | Measure voltage and current simultaneously. Useful for power-supply monitoring. |
| VDC | VAC | DC and AC volts, simultaneously. Example use: supply voltage and ripple. |
| VDC | Ohms | Alternate between ohms and volts measurement. DC volts shown will depend on how quickly the measured circuit charges and discharges during swapping of modes; thus, capacitance of the circuit may be inferred. |

A meter incorporating the present invention is shown at 50 in FIG. 5. Therein, inputs 33a and 33b are provided for the two sets of input leads. The primary and secondary displays 36a and 36b generate the displays of two characteristics, whether of the same electrical parameter or of two different parameters, in accordance with a selection by keys 52. The displays further provide identification of the characteristics being displayed, as well as polarity signs therefor.

It should be understood that although operation in the illustrated presently preferred embodiment provides for performance of both measurement functions by measuring circuit 32 prior to output of display signals, so that both displays are provided at a single operating step 48, operation may be modified as follows. Specifically, the primary result may be provided to display driver 38 in a separate step, which may be inserted in the flow chart of FIG. 4 immediately preceding step 46. Similarly, the secondary result may be provided alone, at step 48. Thus, the two displays may be updated alternately, while the two measurements are nonetheless concurrently displayed.

Further, although the sequence of measurements performed by the inventive structure is illustrated by only two measurements described in the foregoing illustration, it will be clear to one of ordinary skill that the flow chart of FIG. 4 may be further modified to control measuring circuit 32 to perform any number of measurements on any number of parameters, and to provide the appropriate displays. Moreover, although in the preferred embodiment the number of displays and the number of measurements are equal, it is possible that a lesser number of displays may be used for a greater number of measurements, and that display indicators may be provided for identifying the specific measurement results being displayed. It is similarly possible to modify operation of the invention by using the same for measurement of a smaller number of characteristics than the number of displays provided.

It should thus be clear that the preferred embodiment of the invention is provided for illustration and not limitation of the invention, which is described by the claims appended hereto and which includes all the variations and modifications to which the claims are legally and equitably entitled.

What is claimed is:

1. A measuring apparatus for controllably measuring a plurality of characteristics of parameters under test comprising:
   single measuring means for measuring at one time only one of said plurality of characteristics of said parameters under test;
   input means for providing said parameters under test to said measuring means;
   control means for selecting a plurality of characteristics of said parameters provided by said input means to be sequentially measured by said single measuring means;
   said measuring means providing plural data representations of said plurality of characteristics sequentially measured by said single measuring means; and
   plural display means for concurrently displaying said plural data representations of said plurality of characteristics sequentially measured by said single measuring means.

2. A measuring apparatus as recited in claim 1 wherein said control means comprises a programmable microprocessor means, said microprocessor means programmed for selecting a first characteristic to be measured by said single measuring means, and for selecting thereafter a second characteristic to be measured by said single measuring means, whereby said plural display means concurrently display measurement results and functions of said sequentially performed measurements.

3. A measuring apparatus as recited in claim 2 further comprising keyboard input means for programming said programmable microprocessor means to select said first and second characteristics to be measured.

4. A measuring apparatus as recited in claim 2 wherein said input means comprises at least one pair of input connectors for connecting an input of said single measuring means to electrical parameters for measurement, and wherein said programmable microprocessor means is further programmed for selecting first and second functions to be performed by said single measuring means on said electrical parameters to measure said first and second characteristics.

5. A measuring apparatus as recited in claim 4 further comprising keyboard input means for programming said programmable microprocessor means to select said first and second characteristics to be measure.

6. A measuring apparatus as recited in claim 4, wherein said programmable microprocessor means is operable for selecting said first and second functions to be different functions to be performed by said single measuring means on a single electrical parameter.

7. A measuring apparatus as recited in claim 4, wherein said programmable microprocessor means is operable for selecting said first and second functions to be a single function to be performed by said single measuring means on two different electrical parameters.

8. A measuring apparatus as recited in claim 4, wherein said input connectors comprise probes for probing electrical characteristics at predetermined test points.

9. A measuring apparatus as recited in claim 1 wherein said control means comprises: a programmable microprocessor means, said microprocessor means programmed for selecting a first characteristic to be measured by said single measuring means, and for selecting thereafter a second characteristic to be measured by said single measuring means; at least two sets of input connectors being provided for connecting inputs of said single measuring means to at least two sets of electrical parameters for measurement; said programmable microprocessor means being further programmed for selecting first and second functions to be performed by said single measuring means on said two sets of electrical parameters to measure said first and second characteristics.

10. A measuring apparatus as recited in claim 9, wherein said input connectors comprise probes for probing electrical characteristics at predetermined test points.

11. A measuring apparatus as recited in claim 9, wherein said programmable microprocessor means is operable for selecting said first and second functions to be different functions to be performed by said single measuring means on a single electrical parameter.

12. A measuring apparatus as recited in claim 9, wherein said programmable microprocessor means is operable for selecting said first and second functions to be a single function to be performed by said single measuring means on a two different electrical parameters.

13. A measuring apparatus for controllably measuring a plurality of characteristics of a number of electrical signals from a number of electrical test points under test comprising:

single time-shared measuring means for measuring at one time only one of said plurality of characteristics of said number of electrical signals under test;

input means for providing said number of electrical signals under test to said measuring means;

control means for selecting a plurality of characteristics of said number of electrical signals provided by said input means to be sequentially measured by said single measuring means;

said measuring means providing plural output signals respectively representing said plurality of characteristics sequentially measured by said single measuring means; and plural display means for respectively and concurrently displaying said plural output signals representing said plurality of characteristics sequentially measured by said single measuring means.

14. A measuring apparatus as recited in claim 13, wherein said number of electrical signals comprises a plurality of electrical signals, said input means thereby operable for providing said plurality of electrical signals under test to said measuring means.

15. A measuring apparatus as recited in claim 13, further comprising operator controlled keyboard means for controllably selecting desired characteristics to be measured by said single measuring means for display on said plural display means.

16. In a digital multimeter measuring apparatus for measuring any of a plurality of characteristics of an electrical signal, including probe means for providing to a measuring circuit an electrical quantity to be measured thereby, a computer control means for controlling the measuring circuit to measure a desired characteristic in accordance with activation of a control key by an operator, the computer control means further operable for reading from the measuring circuit an output value corresponding to the characteristic being measured and for converting the value to a display format, and a display driver responsive to the display format for driving a display, the improvement comprising:

a plurality of displays provided in said digital multimeter for concurrently displaying a plurality of characteristics measured in a sequential manner by said measuring circuit, and program controlled means in said computer control means, responsive to plural key activations by the operator, for controlling said measuring circuit to measure repeatedly and sequentially a plurality of characteristics selected by the operator, said program controlled means further operable for reading a sequence of result data provided by said measuring circuit and for providing said result data representing the selected characteristics to respective ones of said plurality of displays.

* * * * *